United States Patent [19]
Brubaker

[11] Patent Number: 5,308,989
[45] Date of Patent: May 3, 1994

[54] FLUID FLOW CONTROL METHOD AND APPARATUS FOR AN ION IMPLANTER

[75] Inventor: Stephen R. Brubaker, Austin, Tex.

[73] Assignee: Eaton Corporation, Cleveland, Ohio

[21] Appl. No.: 995,155

[22] Filed: Dec. 22, 1992

[51] Int. Cl.5 .............................................. H01J 37/18
[52] U.S. Cl. ........................ 250/441.11; 250/492.21; 414/217; 414/220; 414/221
[58] Field of Search ............... 250/441.11, 492.21; 414/217, 220, 221

[56] References Cited

U.S. PATENT DOCUMENTS

| | | | |
|---|---|---|---|
| 4,987,933 | 1/1991 | Mack | 141/7 |
| 5,013,384 | 5/1991 | Mellink et al. | 414/217 |
| 5,145,303 | 9/1992 | Clarke | 414/217 |

OTHER PUBLICATIONS

Design considerations for low particulates in Varian implantation equipment, McKenna date unknown.

Primary Examiner—Jack I. Berman
Attorney, Agent, or Firm—Watts, Hoffmann, Fisher & Heinke

[57] ABSTRACT

A fluid flow control for use with a process chamber. In the disclosed embodiment, the process chamber is for ion implantation of a workpiece such as a silicon wafer and the fluid flow control is to assure the flow rates are maintained at values which are efficient in evacuating and pressurizing the chamber do not dislodge particulate contaminants from the process chamber walls. In the disclosed design, wafers are inserted into the chamber by use of a loadlock which avoids the requirement that the process chamber be cyclicly pressurized and depressurized. A diffuser plate intercepts fluid flowing into and out of the process chamber.

18 Claims, 13 Drawing Sheets

FLUID FLOW CONTROL METHOD AND APPARATUS FOR AN ION IMPLANTER

TECHNICAL FIELD

The present invention concerns method and apparatus for minimizing particle contamination caused by repeated pressurization in a process chamber.

BACKGROUND ART

One example of a manufacturing process that requires controlled evacuation and repressurization of a work station is the process of controlled doping of silicon wafers with ions in an ion implantation chamber. Ions from a source are accelerated along an ion travel path to impinge upon the wafers and introduce controlled doses of impurities into the silicon wafer. The ion travel path must be evacuated to assure the ions are well collimated. To accomplish this process in the prior art, wafers have been introduced to an ion implantation chamber, either through a loadlock or by introducing the wafers directly into the implantation chamber. If a loadlock arrangement is used; the loadlock chamber is successively evacuated and pressurized as wafers are inserted into the loadlock on their travel path to the ion implantation chamber. If no loadlock is used, the wafers are inserted directly into the ion implantation chamber which itself must be pressurized, evacuated, and then repressurized as the workpiece are inserted into the chamber, treated and then removed.

Other examples of processes involving pressurization and depressurization of a chamber are known in the prior art. In a sputter coating procedure, for example, a workpiece is inserted into a treatment chamber and then a coating is applied to the surface of the work piece by sputtering the coating material away from a target. This procedure can be used, for example, in coating magnetic material into a recording medium. Again, prior to conducting the coating process, the work piece must be inserted into the chamber and then the coating process conducted at a reduced pressure.

It is often a requirement in these processes that the level of contaminants within the processing chamber is kept at a minimum. If the contaminant level in a doping chamber, for example, exceeds a specified value, the semi-conductor yield of the process will be reduced.

Although steps are taken to reduce the level of particulate contamination within a processing chamber, these steps cannot totally avoid such contaminants. Particulates are inevitably introduced, for example, as the workpieces are inserted into an ion implantation chamber. These particulates tend to settle on the interior walls of the chamber and remain in place until air flow that occurs during chamber evacuation and repressurization dislodge the particles causing them to move within the chamber. If the particulate contaminants remain attached to the chamber walls, the work piece can be inserted into the chamber, treated, and removed without undue contamination. It is when the particles are dislodged and come to rest on the workpiece either before or after the ion implantation process that the particles' presence reduces production yield.

Prior art U.S. Pat. No. 4,739,787 to Stoltenberg which issued Apr. 26, 1988 recognizes the possibility for contaminant presence effecting the yields during semi-conductor wafer fabrication. This patent recognizes the possibility of dislodging contaminants from chamber walls as air enters and exits the process chamber. As a proposed solution to the dislodging problem, the '787 patent recommends the use of "soft-start valves" which open in accordance with a controlled profile so that "turn on" turbulence is reduced. Specifically, the '787 patent calls for a pressurization and depressurization of a chamber in accordance with a time profile.

Prior art loadlocks have at least partially addressed particle transport mechanisms, but none has been able to achieve evacuation times of the order of two seconds to satisfactory throughput in an ion implanter which processes wafers serially.

Recent attention has been focused on aerodynamic transport of particles under supersonic flow conditions. See U.S. Pat. No. 4,836,233 to Milgate, Ill. See also U.S. Pat. No. 4,987,933 to Mack, which is incorporated herein by reference.

During venting of a loadlock, if supersonic flow occurs within the system, it can produce turbulence that strips particles from the surfaces in fluid communication with the loadlock. The Mack design isolates the region of supersonic flow from particle contamination by confining the supersonic flow to a region in the annular vent gas inlet region by using large flow expansion in this region so the flow transitions to subsonic, and by assuring that under all operating conditions, flow is out of this region into the lock bell to prevent influx of particles. These features work together to minimize the deleterious effects of supersonic flow.

Turbulence presents several problems in areas where particle transport is to be minimized. In laminar flow, the lines of flow tend to transport particles in the direction of bulk flow, but in turbulent flow in which eddy currents occur throughout the flow stream, particles can flow upstream of the bulk flow direction. In corners and dead spaces where there are abrupt changes in flow area, eddy currents cause flow to recirculate under either laminar or turbulent flow. These eddy currents and recirculating flows interfere with any efforts to clean the chamber using the flow of fluid over the internal surfaces. Laminar flow is thus to be preferred for its superior ability to sweep already entrained particles along with the bulk flow—a property essential for effective flow induced cleaning. Smooth, well-controlled flow sections are also desirable.

A second problem with turbulent flow is that it is characterized by a higher surface stress and thus more effectively removes and entrains particles to chamber surfaces. This property, while being valuable during cleaning, is problematic during venting since it will tend to detach particles from the wall and deposit them on the wafer surface.

It is thus important to take whatever measures can be taken to eliminate the possibility of turbulent flow and to eliminate regions of abrupt changes in flow area which might trap particles during cleaning.

The prior art system depicted in FIGS. 14A, 14B includes a chamber C with fluid ports P extending circumferentially around a wall of the chamber and located beneath a wafer W supported within the chamber C. Flow paths within the chamber are non-radial. This design is incorporated in a medium current implanter available from Eaton under the designations 6200 A and AV. With non-radial flow, the maximum flow velocity is not minimized. For example, assume that there is one hole at the chamber edge for admitting vent gases and the maximum flow velocity occurs at that hole. If there were two holes, the maximum velocity could be reduced by half. Addition of holes at the periphery would further decrease the maximum velocity until in the limit there is a slit of given width around the periphery of the chamber. This line of reasoning demonstrates that they way to minimize the peak flow velocity is to introduce air around the periphery as evenly as possible. This causes the Reynolds number to be minimized and thus the viscous drag and the probability of entraining particles. Another disadvantage of this lock is that flow can sweep particles from the back of the wafer or the bottom of the loadlock onto the font face of the wafer.

A prior art medium current implanter from Varian, designated by Model No. E220, is believed to include a chamber with large dimensions transverse to the flow path and abrupt changes in the flow cross-sectional area. The fluid flow in this system is believed to be generally radial around the wafers during both pumping and venting. The abrupt changes in flow cross section, however, may cause eddy currents which make flow cleaning difficult. The large dimensions transverse to flow cause large Reynolds numbers and thus decrease the velocity at which turbulent flow and thus particle entrainment occur. The large dimension also should result in longer pumping time. There is also evidence that the higher the Volume to Surface ratio, the more particle agglomeration occurs at a given level of humidity.

Surface preparation has been shown to affect particle generation and transport in high purity gas distribution systems. It has also been shown to affect outgassing characteristics of materials. Treatments which create smooth, continuous, dense and inert surfaces are advantageous in both respects. These surfaces can be achieved by combinations of mechanical, electrochemical and chemical treatments which may include polishing and cleaning processes. Application of these surface treatment techniques can improve the lock's initial particle performance and thus improve its transport of particles at initial pumpdown since lower gas loads from outgassing either shorten the pumping time or allow more restrictive throttling of gas flow during early parts of the evacuation cycle.

DISCLOSURE OF THE INVENTION

The present invention concerns a system for treating one or more silicon wafers and includes a chamber that defines a chamber interior into which the one or more silicon wafers are moved for treatment. Silicon wafers are moved into the chamber prior to treatment and removed from the chamber after they have been treated. Fluid enters the chamber through a first passageway and is withdrawn from the chamber through a second passageway. A flow controller adjusts fluid flow entering or exiting the chamber via the first and second passageways. A diffuser device mounted relative a wafer support within the chamber intercepts fluid flowing into and out of the chamber and inhibits particle dislodgement from chamber walls.

A preferred embodiment of the invention has a vacuum loadlock which has a platform for holding a wafer, and a mechanism for raising and lowering structure for sealing a wafer on the platform at a controlled pressure. One tube admits gas for venting, a second tube admits gas for cleaning, and a third tube for evacuating the loadlock chamber. Valves switch on and off these respective flows, and a control system automatically controls all loadlock functions.

The loadlock diffuser device preferably includes a solid disc spaced from the loadlock by an annular space whose width is roughly equal to the distance between the disc and the wafer support. A transition region between the roof and walls of the loadlock is radiused with a radius roughly the same as the spacing between the solid disc and the loadlock roof.

The tubes for admitting and exhausting the gas are arranged concentrically with each other and with the loadlock chamber. An outermost annulus admits vent gases such as nitrogen through a tube in the wall of the annulus. A region for flow distribution is defined by the space above a flow restricting ridge that juts out into the annulus. A region for flow expansion and deceleration is defined below this ridge. During venting, gases flow in through the tube, reach supersonic speed in the upper annular region, are over-expanded and decelerated. They then flow past the ridge-restrictor and are decelerated and slowly expanded as they flow radially outward across the solid disc. The gases then turn 90 degrees at the loadlock wall, and then again flow radially inward over the wafer. This gentle deceleration and low-velocity 180-degree turn together act to allow particles to settle out of the fluid in the region above the disc or cause them to impact the loadlock chamber wall.

A second annular space is used for evacuating the loadlock chamber. Above this space is a valve connected to a vacuum pump. When the valve opens, the gas flows radially outward over the wafer, turns upward, and accelerates as it flows radially inward above the solid disc. This acceleration keeps the boundary layer thin and thus enhances aerodynamic transport of particles from the top side of the solid disc outside the loadlock. The radial flow around the entire periphery of the loadlock minimizes the velocity at any given point and minimizes transport of particles to the wafer surface from the bottom side of the disk and from beneath the wafer surface.

A third concentric tube is used for admitting cleaning gas to flush particles from the interior surfaces of the loadlock. It extends through the solid disc. Gas at a substantially higher flow rate than experienced during venting flows into the region below the disc and removes particles on the interior surfaces of the loadlock. The evacuation valve, being alternately open and closed, allows the cleaning gas to travel in and out of the loadlock chamber in a circuitous route, facilitating an effective cleaning cycle.

BEST MODE FOR CARRYING OUT THE INVENTION

Figure 1:
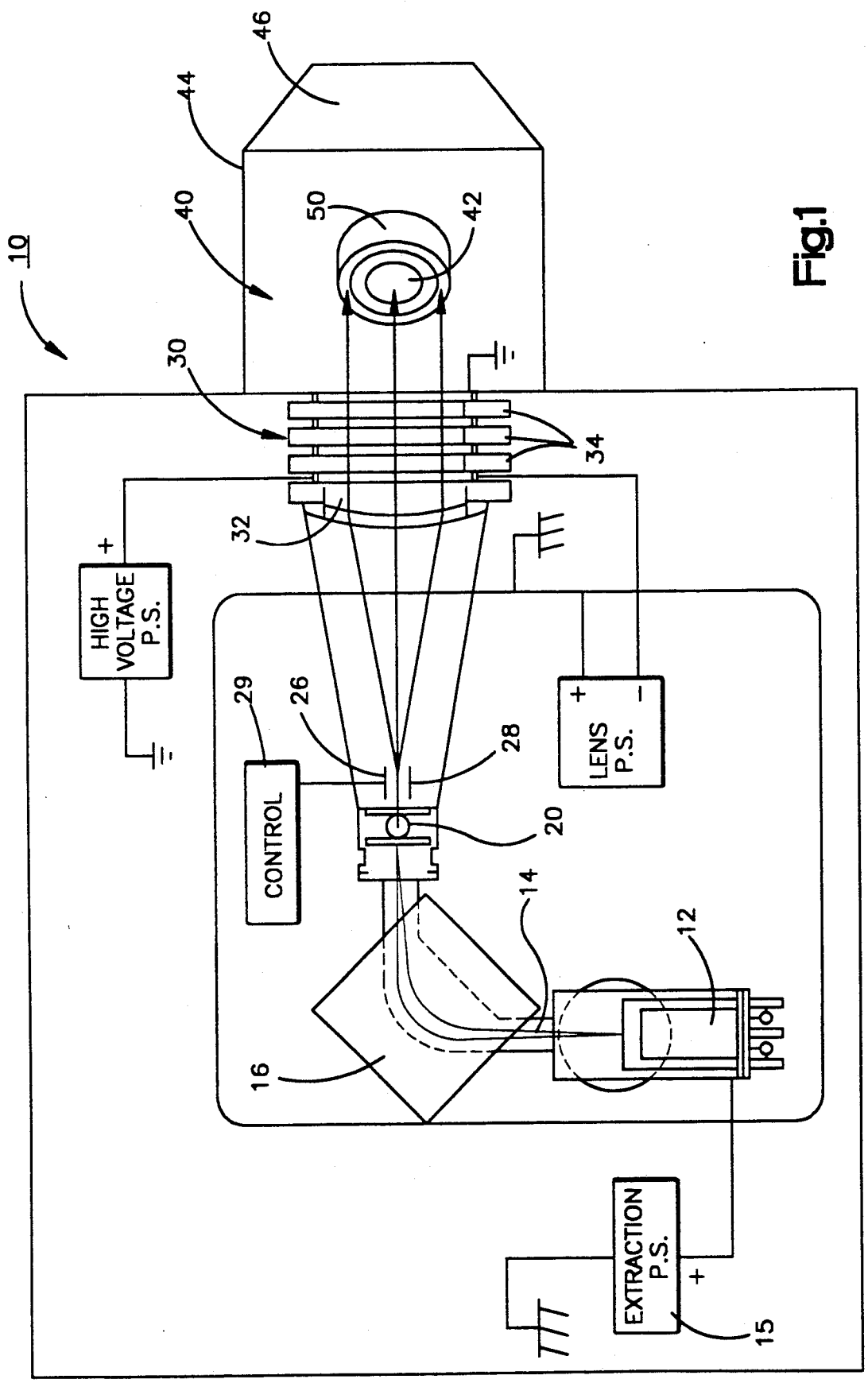
FIG. 1 is a schematic of an ion implantation system for treating silicon wafers.

Turning now to the drawings, an ion implantation system 10 is illustrated having an ion source 12 for generating an ion beam 14. An extraction power supply 15 biases an extraction electrode to a potential (approximately 20 kV) that accelerates the ions from the source 12 along a trajectory leading to an ion mass analyzing magnet 16. The magnet 16 bends the beam at approximately a right angle and directs ions having an appropriate mass along a travel path through a shutter 20. The shutter 20 rejects ions having an inappropriate mass from the ion beam 14.

The beam 14 then passes through a pair of deflection electrodes 26, 28. Control voltages applied to the electrodes 26, 28 by a control circuit 29 cause the ion beam to pass through electric fields which deflect the ion beam 14 by a controlled amount. The magnitude of the voltage difference between the two plates 26, 28 is varied by the control circuit 29 to control the deflection angle. The deflected ion beam enters a beam accelerator 30 where ions are redirected along generally parallel paths. The beam accelerator 30 includes a curved metallic entrance electrode 32 and a plurality of spaced, parallel metallic plates 34. After passing through the accelerator 30 the ions in the beam have been both redirected to a desired trajectory and accelerated to a final implantation energy. Additional details regarding the ion implantation system depicted in FIG. 1 are contained in U.S. Pat. No. 5,091,655 to Dykstra et al. which is incorporated herein by reference.

Downstream from the beam accelerator 30, an ion implantation station 40 includes structure that supports a semiconductor wafer 42 at a position to intercept ions that have been accelerated by the beam accelerator. Ion beam collisions with other particles degrade beam integrity so that the entire beam line from the source 12 to the implantation station 40 is evacuated. At the region of the ion implantation station 40 a process chamber 44 is evacuated and the wafers are inserted into and withdrawn from a loadlock 46 to avoid repeated pressurization and depressurization of the chamber 44.

The scanning electrodes 26, 28 produce side-to-side beam scanning of a controlled amount under the direction of the control circuitry 29. The circuitry includes a programmable controller for adjusting the scanning electrode voltages to achieve this wafer scanning. The particular system depicted in FIG. 1 produces only side-to-side scanning so that to implant an entire workpiece surface of a circular wafer depicted in FIG. 1, an additional relative motion between the deflected ion beam and the workpiece is necessary. In this implementation, a linear back and forth scan of the wafer 42 (perpendicular to the plane of the ribbon ion beam) is achieved through a drive mechanisms attached to a wafer support 50.

LOADING STATION

A wafer loading station 112 (FIG. 2) operates in atmosphere and includes a platform 118, first and second rotatable cassette receiving stations 120a, 120b mounted on the platform; a plurality of cassette stations 122a, 122b, 122c, 122d arranged in a circular pattern C on the platform; a wafer orienter 123 located on the circular pattern circle; and a robotic wafer handler 124 on a axis 130 of the circle C.

The rotatable cassette receiving station 120a is shown in full line in position to be loaded from an external source. The second cassette receiving station 120b is shown in full line rotated in position to place a cassette 126 on the circle C. It can be seen that cassette receiving station 120a is capable of receiving a cassette at the front of the loading station and transferring it to cassette station 122a and that receiving station 120b is capable of receiving a cassette and transferring it to cassette station 122c. Cassette station 122d is a buffer station in which the cassette is manually positioned. The rotatable receiving stations can be selected from a number of commercially available mechanisms which are not part of the present invention. The wafer orienter 123 is also located on the circle C to put the wafers in the proper angular orientation for implanting as is well known in the art.

Wafers 42 are transferred from a cassette station 122 to the orienter 123 and from the orienter into the loadlock 46 by means of the robot wafer handler 124, which can be of the type described in U.S. Pat. No. 5,046,992, which is incorporated herein by reference. The robot wafer handler 124 is located on the axis 130 of the circle C and comprises a first arm 125, a second arm 127 pivotally connected to the first arm 125 and a third arm 129 pivotally connected to the second arm 127. The end of the third arm 129 includes a wafer retainer 132. As described in U.S. Pat. No. 5,046,992, the robot wafer handler 124 is capable of rotating about the axis 130 into alignment with the cassettes and with the orienter. The arms 125, 127, 129 are interconnected in a manner which permits the wafer retainer element 132 to move radially for pickup and deposit of the wafers while maintaining a desired angular orientation of the wafer. The robot wafer handler 124 is also movable in and out of the plane of FIG. 2 to raised and lowered positions aligned with other wafers within a cassette and with the loadlock station 46.

In operation, wafers are transferred by the robot wafer handler 124 from any one of the cassettes 126 to the wafer orienter 123 where the desired orientation is effected, after which the wafer is removed from the orienter 123 and transferred to the loadlock 46 which also defines a wafer position centered on the circle C.

Loadlock

Figure 3:
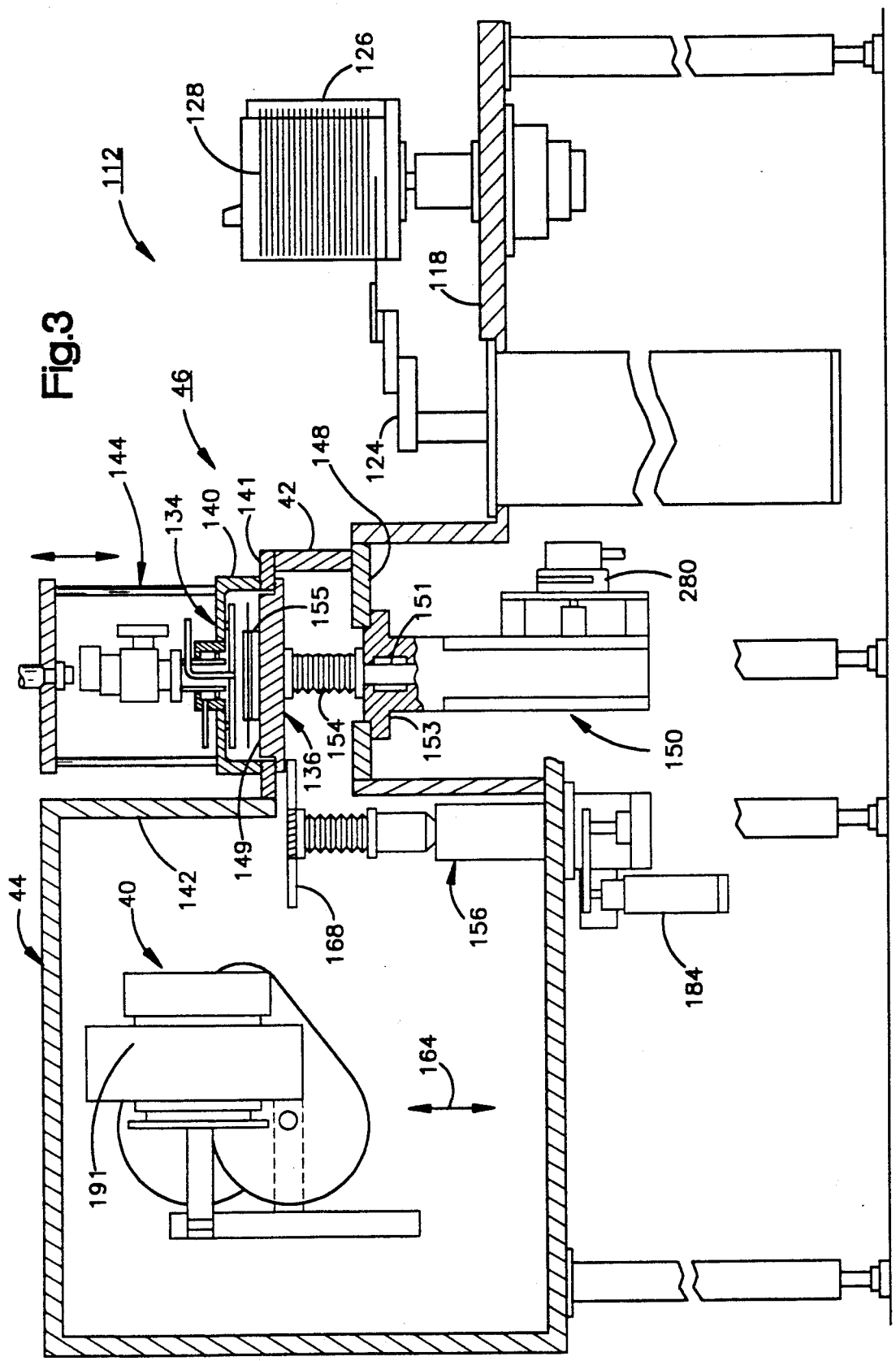
FIG. 3 is a partially sectioned elevation view of the FIG. 2 implantation chamber and loadlock.

Referring particularly to FIG. 3, the loadlock 46 comprises an upper loadlock assembly 134 and a lower loadlock assembly 136, and is positioned to receive wafers transferred from the loading station 112 by the robot wafer handler 124. The upper loadlock assembly comprises a concave dish or bell-shaped wafer enclosing member 140 sealingly engaged with the top surface of a cover plate 141 which, along with a wall 142, defines an extension of the implantation chamber 44.

A vertical drive mechanism 144 moves the dish-shaped member 140 vertically to disengage it from the plate 141. This movement allows the robot wafer handler 124 to enter the loadlock 46 and insert a wafer 42. The vertical drive mechanism 144 can be one of many known mechanisms for providing parallel motion, but is illustrated herein as a parallelogram link system 145 mounted on an outside wall 142 of the implantation chamber 44 and driven by a rotary actuator 146 to ensure precise vertical movement of the wafer enclosing member 140.

The lower loadlock assembly 136 comprises a cylindrical valve plate 149 concentric with the member 140 and sealingly engageable by means of an O-ring seal 147 with a bottom surface of the cover plate 141. A drive assembly for raising and lowering the valve plate 149 includes a rod 151 connected at one end to the valve plate 149 and at the other end to a rotary-to-linear drive mechanism 152. The rod 151 is supported and aligned by means of a linear bearing assembly 153 attached to a bottom plate 148 of the loadlock 46. Since the rod 151 penetrates the vacuum chamber, a metallic bellows 154 surrounds the rod and is sealingly attached to the bottom of the valve plate 149 and to the bottom plate 148.

The valve plate 149 supports a wafer-receiving platen 155. In a first, upper position shown in FIG. 3, the valve plate 149 sealingly engages the plate 141 and the platen 155 is in position to transfer wafers to or receive wafers from the robot wafer handler 124. In a second position, the dish-shaped wafer enclosing member 140 is lowered to engage the plate 141 and the platen 155 is lowered for the transfer of wafers between the platen 155 and a wafer transfer arm assembly 156 operable to transfer wafers from the loadlock 46 to the process chamber 44.

Wafer Transfer Arm Assembly 150

Figure 4:
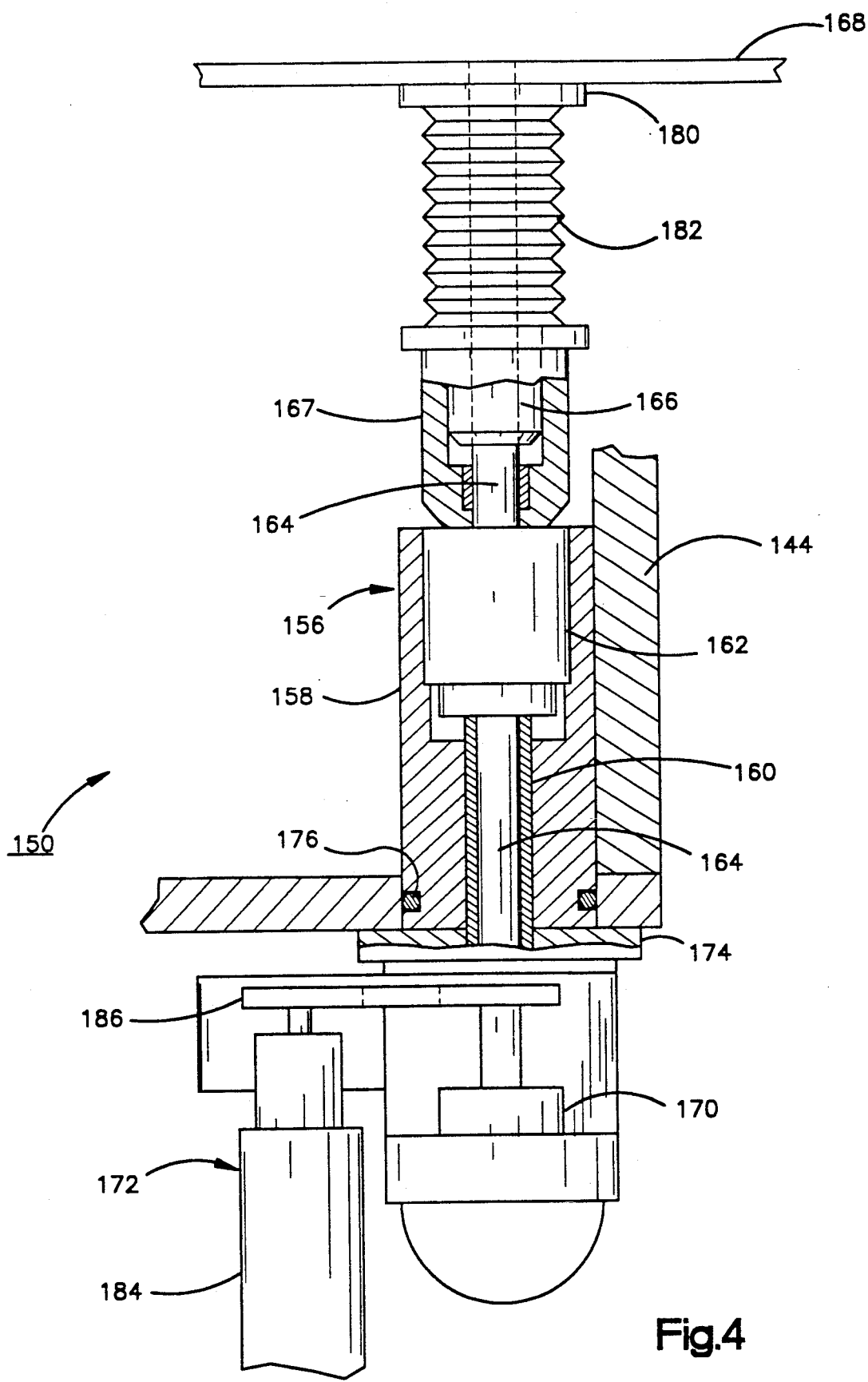
FIG. 4 is a partially sectioned side view of a wafer handler used to remove wafers from the loadlock for placement in the implantation chamber.

Referring particularly to FIG. 4, the wafer transfer arm assembly 150 comprises a housing 158 protruding through and fixed to the implantation chamber 44, an outer shaft 160 extending through a Ferrofluidic vacuum rotary feedthrough 162 received within the housing, an inner shaft 164 supported for linear motion relative to the outer shaft by a ball spline assembly 166 which is housed within a housing 167 fixed to the outer shaft and which couples the outer shaft to the inner shaft, a transfer arm 168 attached to the inner shaft, a linear drive mechanism 170 connected to the inner shaft 164, and a rotary drive mechanism 172 connected to the outer shaft. The housing 158 is a cylindrical member fixed to the implantation chamber by means of a flange 174 and sealed thereto by an O-ring 176.

The inner shaft 164 is supported for linear motion by the ball spline assembly and is attached at its upper end to a hub member 180 fixed to the transfer arm 168. A bellows 182 is received between the hub 180 and the housing 167 to maintain the vacuum integrity of the process chamber 44. The linear drive mechanism 170 includes an air motor connected to a transmission that imparts linear motion to the shaft 164, and will not be described herein in detail. The rotary drive mechanism 172 as illustrated herein comprises a servo motor 184 mounted on the outside of the vacuum chamber and a toothed belt and pulley system 186 operating on the outer shaft 160.

Figure 2:
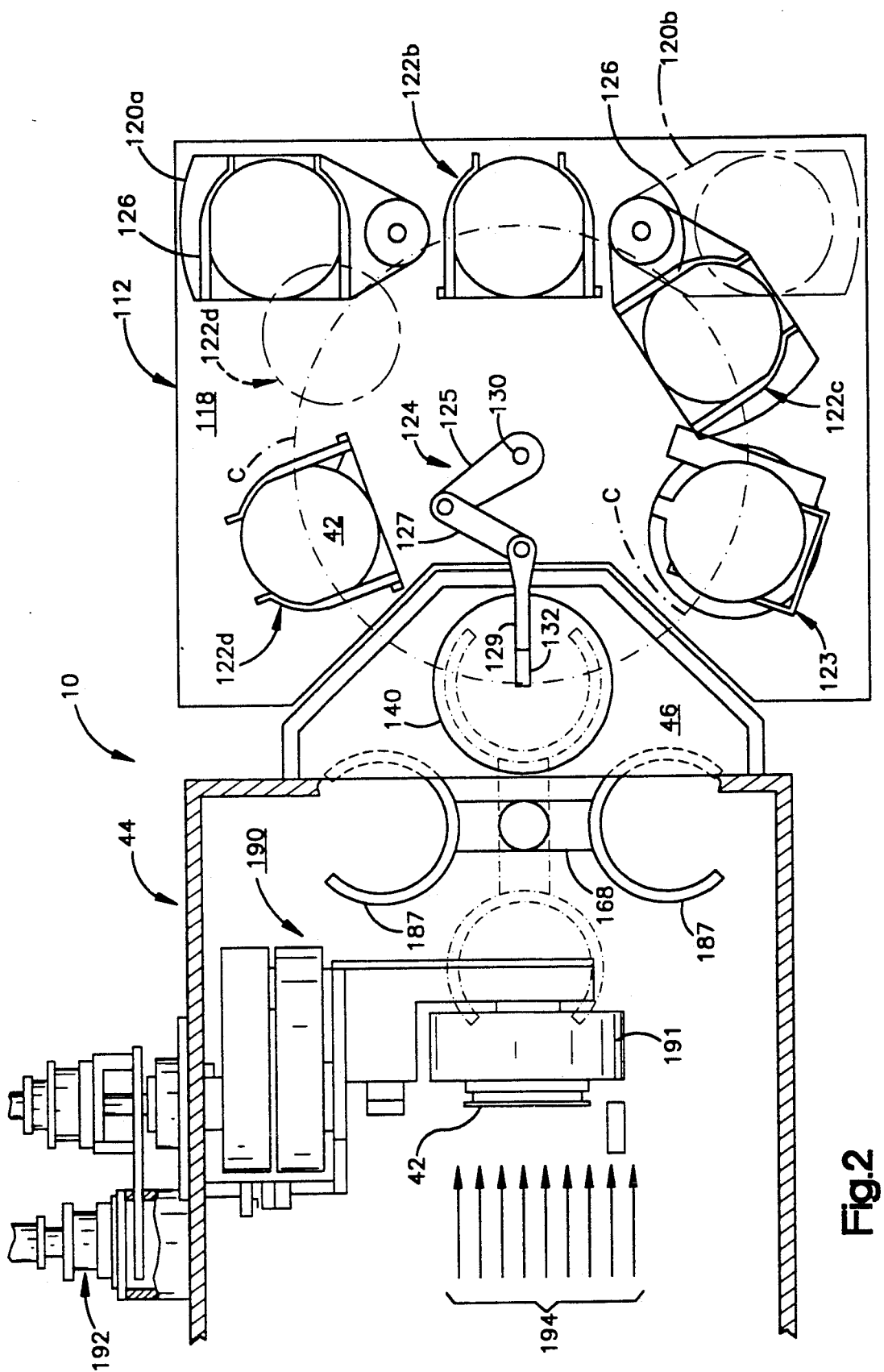
FIG. 2 is an enlarged plan schematic showing an ion implantation chamber and loadlock for inserting and withdrawing silicon wafers from the implantation chamber.

Referring to FIG. 2, a ring-like wafer receiving member 187 is formed at either end of the transfer arm 68. In the solid line position of FIG. 2, the transfer arm 168 is in an inactive position, such as during implantation of a wafer. When a wafer is to be transferred from the loadlock station 14 to the wafer handler 15, the transfer arm is rotated to the broken line position of FIG. 2 and put in a down position. At this time, the lower loadlock assembly will be in its down position. The transfer arm 168 is then raised slightly to pick the wafer off the loadlock platen 55 and then rotated about its center axis 188 by 180 degrees to place the receiving member 187 in position to deposit a wafer onto a second wafer handler 190 for implantation. It will be understood that during this rotation, an implanted wafer on the opposite end of the transfer arm will be simultaneously transferred to the lower loadlock assembly for transport back to the loading station.

Wafer Handler 190

The wafer handler 190 comprises a three-axis arm assembly for orienting a wafer receiving platen assembly 191 mounted on an outer element of a three-arm assembly, and a rotary drive system 192 mounted outside the implantation chamber 44 operable to rotate the platen about its axis.

The rotary drive system is capable of rotating the platen assembly 191 and of moving the platen assembly 191 linearly. This drive system is shown in U.S. Pat. No. 5,046,992 which is incorporated herein by reference.

During ion implantation of the wafer 42, a parallel ribbon beam 194 is created by the electrodes 26, 28 and accelerator 30. The platen assembly 191 is moved by the wafer handler 190 to scan the wafer through the beam 194. The tilt angle of the wafer can also be adjusted as needed to control the angle of impact between the wafer 42 and ribbon beam 194.

Loadlock Evacuation and Pressurization

Figure 5:
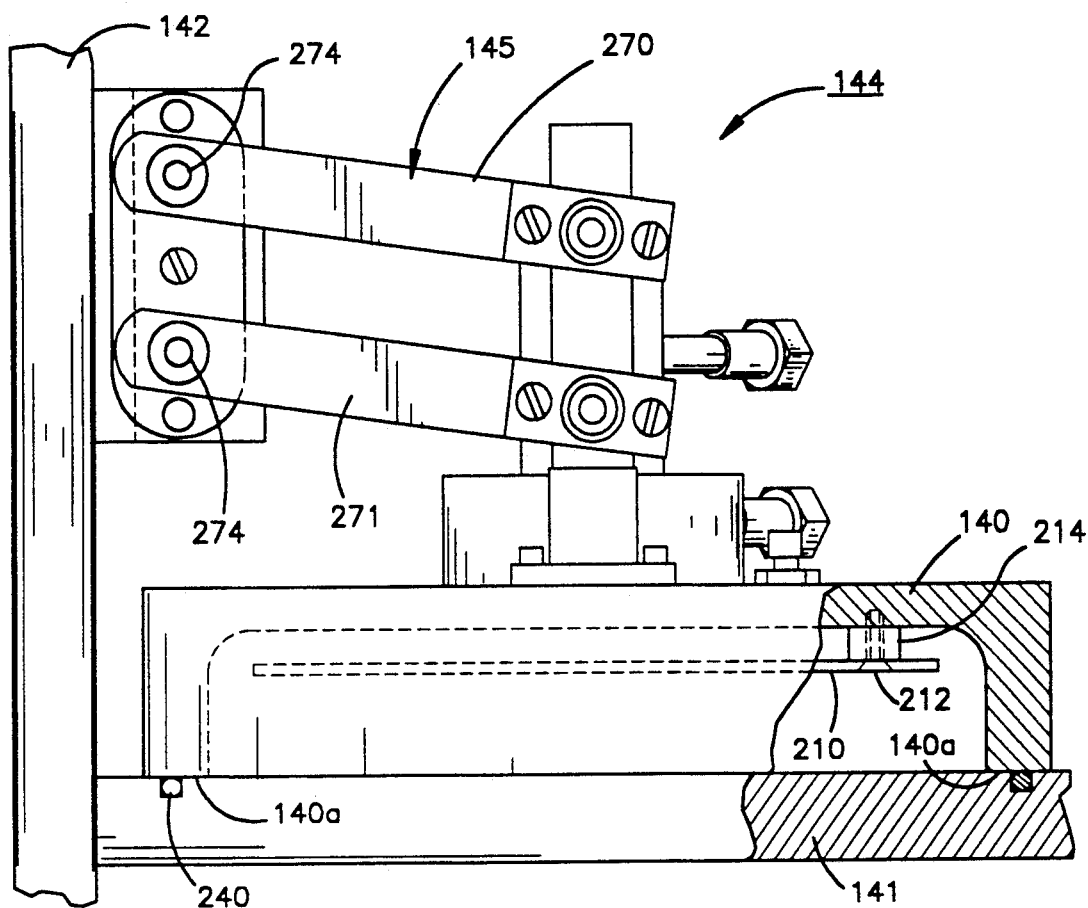
FIG. 5 is a side elevation partially sectioned view of a loadlock upper assembly.
Figure 7:
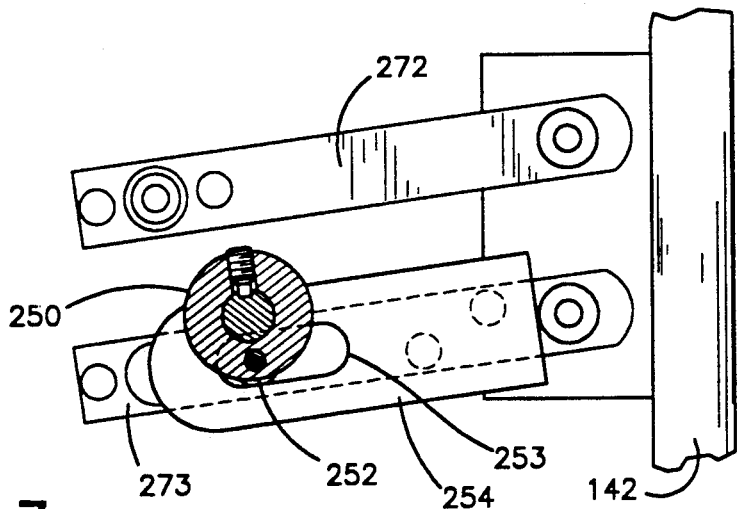
FIG. 7 is a view as seen from the plane defined by the line 7—7 in FIG. 6.
Figure 6:
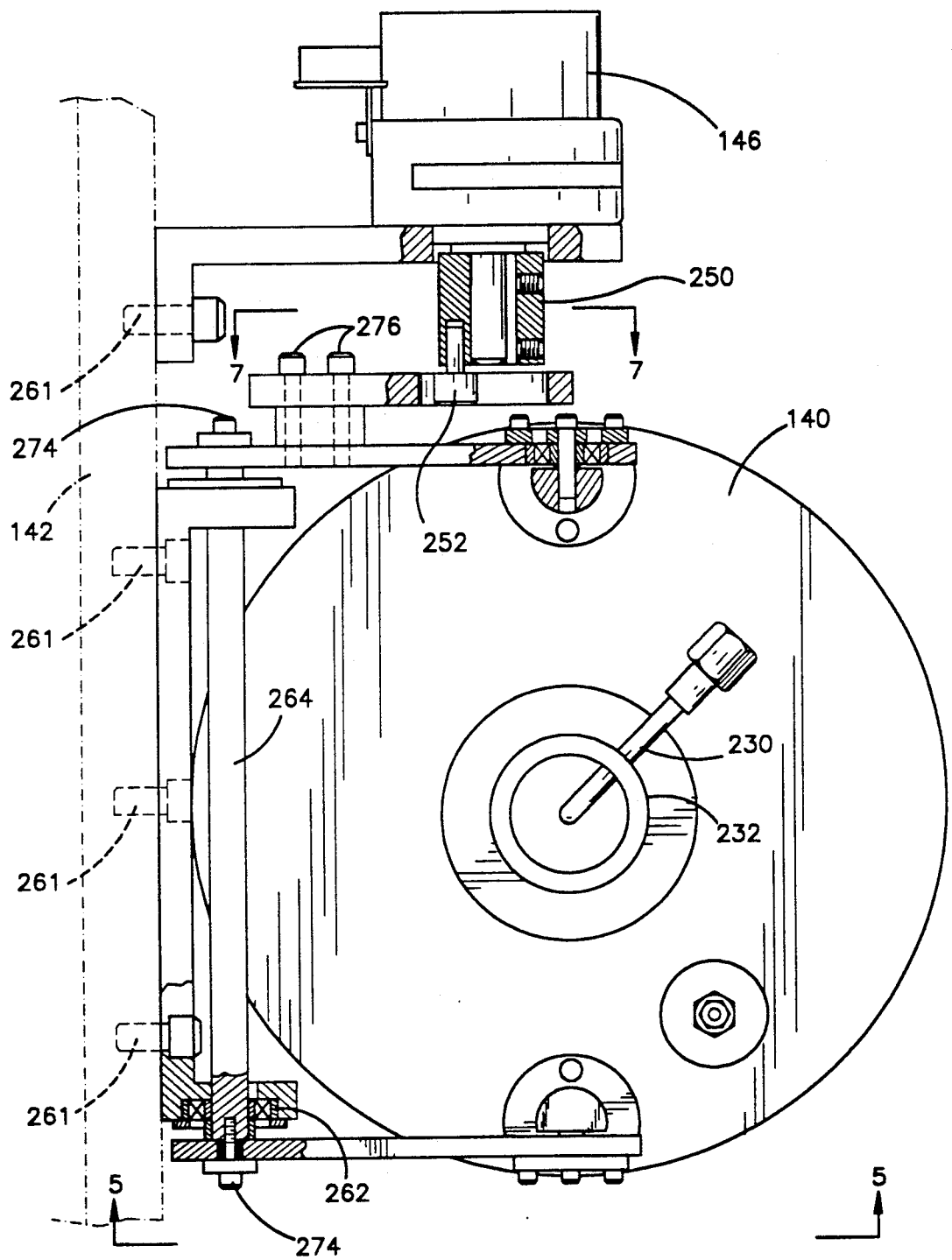
FIG. 6 is a plan view of a motor and a parallel linkage used to raise and lower the FIG. 5 loadlock assembly.

FIGS. 5-7 illustrate details of the upper loadlock assembly 136. The dish-shaped sealing member 140 is shown in FIG. 5 to be in a lowered position so that a peripheral bottom surface 140a engages a top surface of the plate 141. A diffuser plate 210 is oriented generally parallel to the plane defined by a top surface of the platen 155. The diffuser plate 210 is a circular metal member attached to the sealing member 140 by threaded connectors 212 that engage appropriately located threaded openings in the sealing member 140. The diffuser plate 210 is spaced from an inwardly facing surface of the sealing member 140 by spacers or washers 214 through which the threaded connectors extend.

Figure 9:
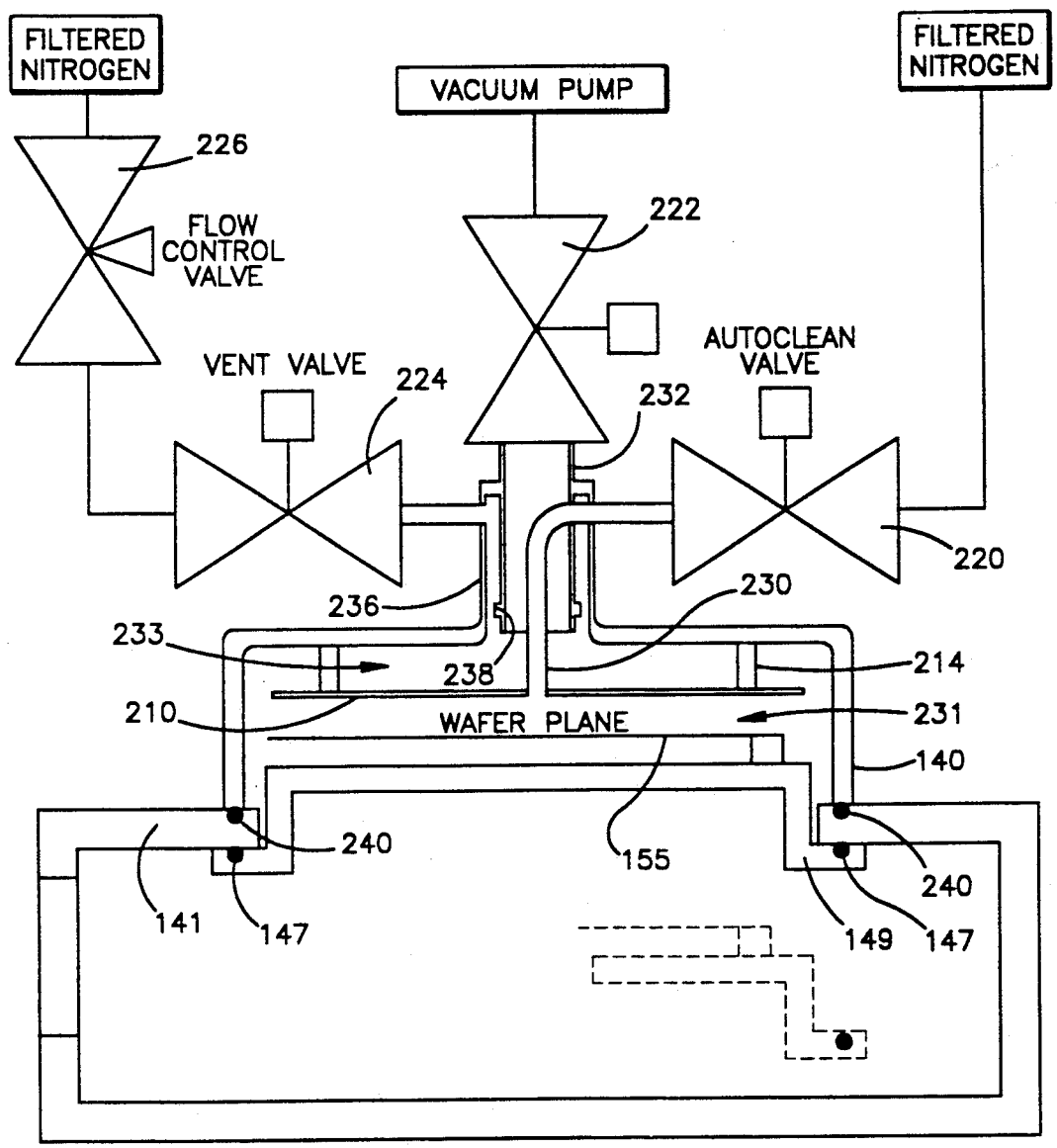
FIG. 9 is a schematic depiction of a flow control system for pressurizing and evacuating the loadlock.

Fluid flow into the region bounded by the dish-shaped member 140 is controlled by three valves 220, 222, 224 (FIG. 9) that regulate fluid flow through passageways leading to the region of the diffuser plate 210. A first valve 220 is coupled to a source of filtered nitrogen. When the valve 220 opens, high pressure nitrogen (pressure of approximately 2-3 psi, but greater pressures are possible) flows through a first passageway 230 and enters a region 231 between the diffuser plate 210 and the platen 155. The high pressure nitrogen flows into this region and cleanses the region of contaminants such as dust and dirt particles.

A second valve 222 allows the region of the wafer to be evacuated by a vacuum pump (not shown). The valve 222 communicates the pressure drop applied by the vacuum pump through a passageway defined by a second conduit 232 to a region 233 above the diffuser plate. This conduit 232 depressurizes the loadlock so that wafers can be moved from the loadlock into the implantation or process chamber. The diffuser plate 210 isolates the wafer from contamination due to dislodgement of particles as the fluid within the loadlock chamber is withdrawn before the wafer is transferred to the process chamber.

A third valve 224 routes pressurized nitrogen from the same nitrogen source that routes nitrogen through the passageway 230. Nitrogen enters into the loadlock chamber along an annular passageway defined by a conduit 236 radially outside the conduit 232 (see FIG. 9). At a lower region of the conduit 236, a ridge 238 juts into the annular region bounded by the two conduits 236, 232. The flow of pressurized nitrogen is regulated by a flow control valve 226 coupled to the nitrogen source. The flow control valve 226 receives high pressure nitrogen and regulates flow of nitrogen into the loadlock chamber.

In the loadlock configuration shown in FIG. 5, the sealing member 140 is in fluid-tight engagement with the plate 141. A groove in the plate 141 accommodates an O-ring 240 to assure a fluid-tight engagement when the upper loadlock assembly 134 is in the lowered position. To raise the loadlock assembly 134, a controller 300 activates the drive mechanism 144 to raise the sealing member 140 and allow the wafer to be removed from or inserted into the loadlock.

Figure 10:
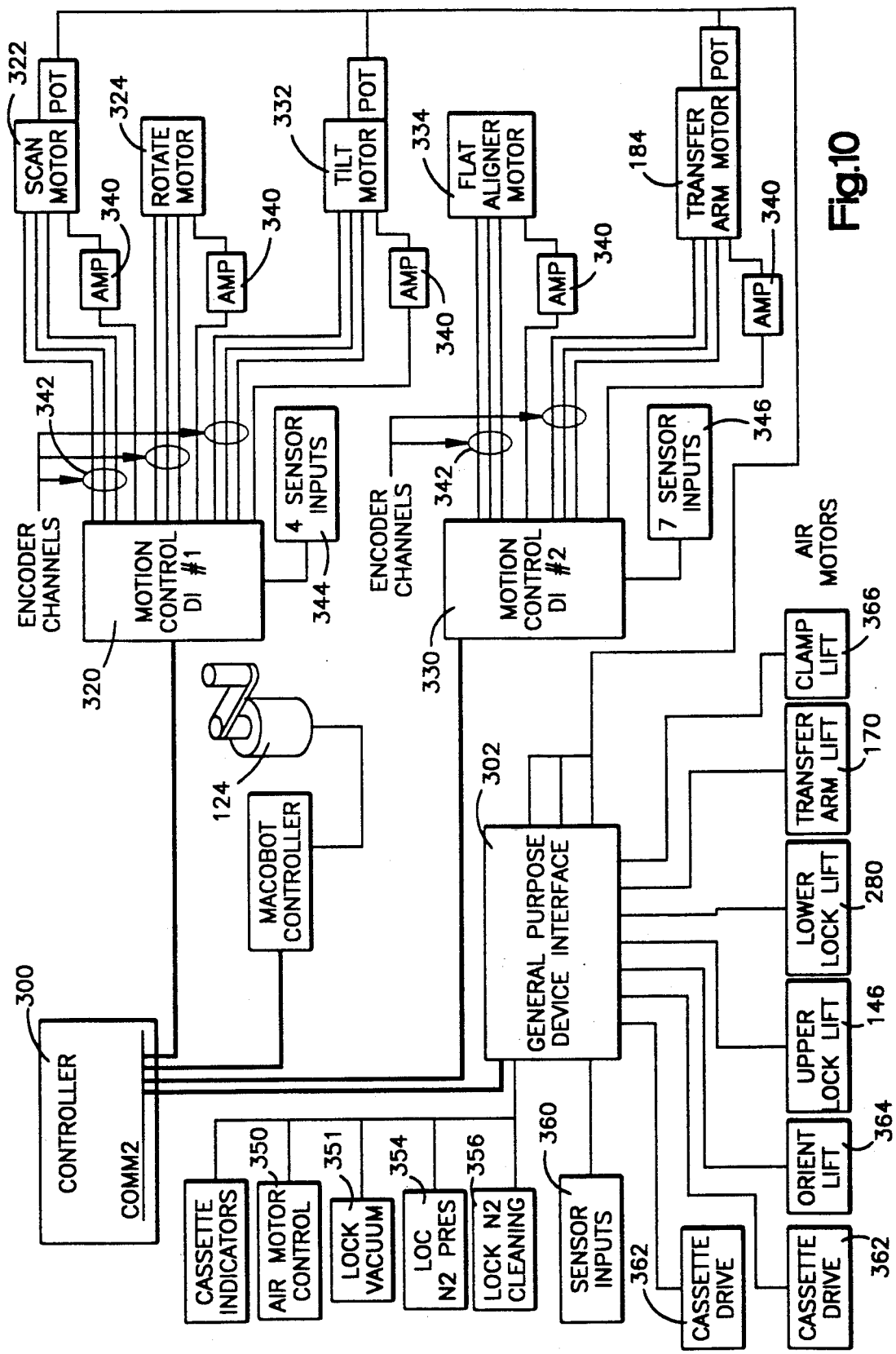
FIG. 10 is a schematic of control electronics for wafer handling.

The drive mechanism 144 preferably comprises a rotary air-driven motor 146 having an output shaft 250 which rotates in response to actuation of the motor by the controller 300 (FIG. 10). As the output shaft rotates, an eccentric drive 252 attached to the output shaft 250 follows a circular travel path. The eccentric drive 252 fits within a slot 253 of a drive linkage 254 connected to the parallel linkage 145 shown in FIG. 5. In response to controlled actuation of the motor 144, the parallel linkage raises the sealing member 140 from the position shown in FIG. 5 to a position which allows the wafer to be moved into and out of the loadlock.

The parallel linkage 145 is attached to the side wall 142 of the implantation chamber by a support block 260. Threaded connectors 261 extend through the support block 260 and into the chamber wall 142. The block 260 carries bearings 262 that rotatably support two shafts 264, 266.

As seen most clearly in FIGS. 5 and 7, the parallel linkage 145 includes four parallel arms 270, 271, 272, 273. A top pair of arms 270, 272 are attached to a top shaft 264 by threaded connectors 274. The bottom two arms 271, 273 are attached to a bottom shaft 266 in a similar fashion by connectors 274. As the eccentric drive 252 moves back and forth through the slot 253 in response to motor actuation of the eccentric drive, the parallel arms are driven up and down to raise and lower the dish-shaped sealing member.

The drive linkage 254 is driven up and down by rotation of the shaft 250. The linkage 254 is rigidly connected to the arm 273 by connectors 276. As the linkage raises and lowers, it pivots and conveys this pivoting motion to the parallelogram linkage.

Figure 8:
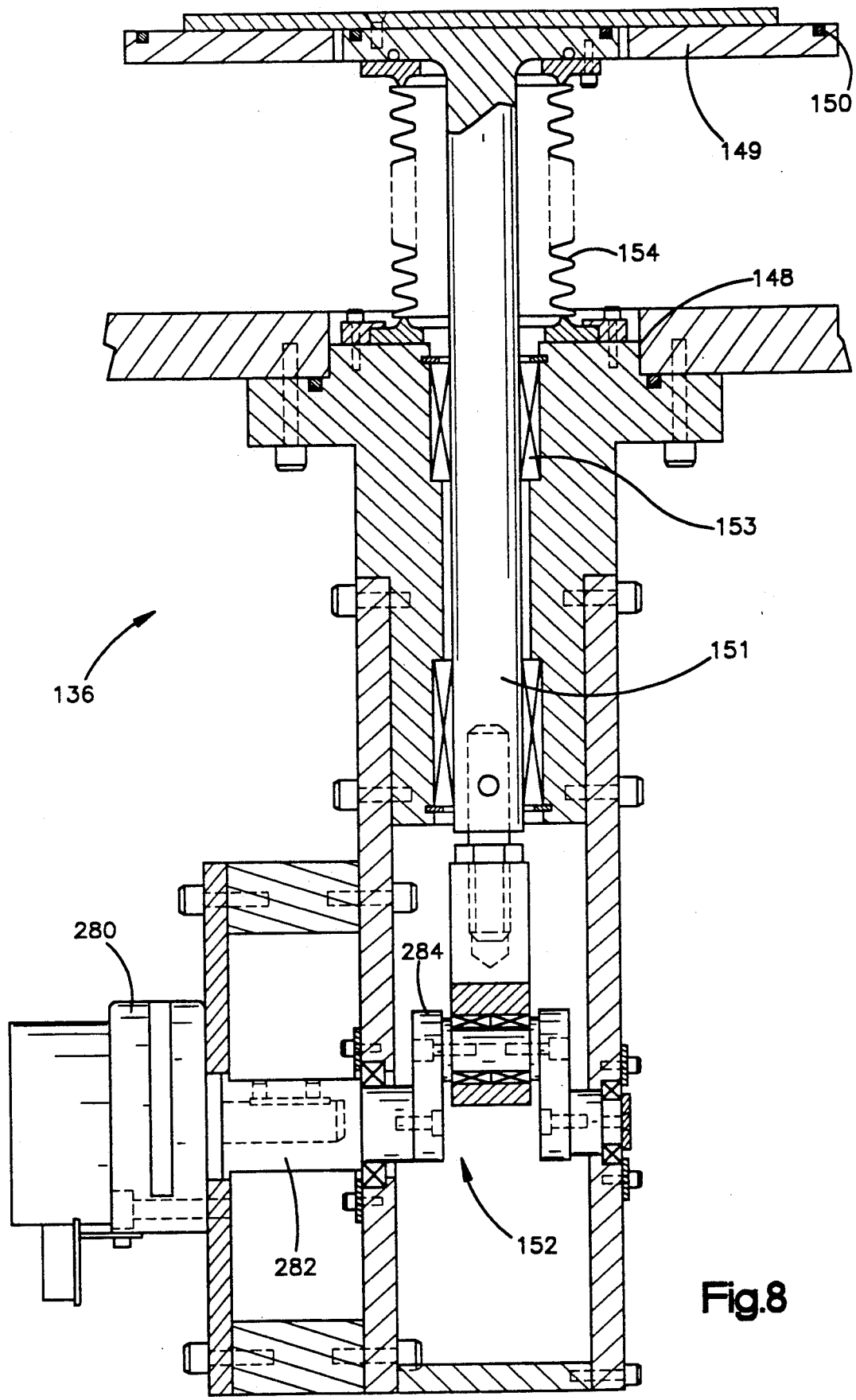
FIG. 8 is an enlarged, partially sectioned view of the lower loadlock assembly for raising and lowering a wafer support.

The lower loadlock assembly 136 is depicted in greater detail in FIG. 8. An air actuated drive motor 280 has an output shaft 282 coupled to an eccentric drive 284 for raising and lowering the rod 151. The motor 280 is connected to the controller 300 by means of an interface 302 which receives control signals from a controller and actuates the motor 280. In this way, the seal plate 149 can be raised and lowered to position the wafers in the loadlock during pressurization and evacuation. As the eccentric drive 284 rotates, a shaft 286 passing through a slot 288 formed in an extension 290 to the rod 151, raises and lowers the rod.

Figure 8A:
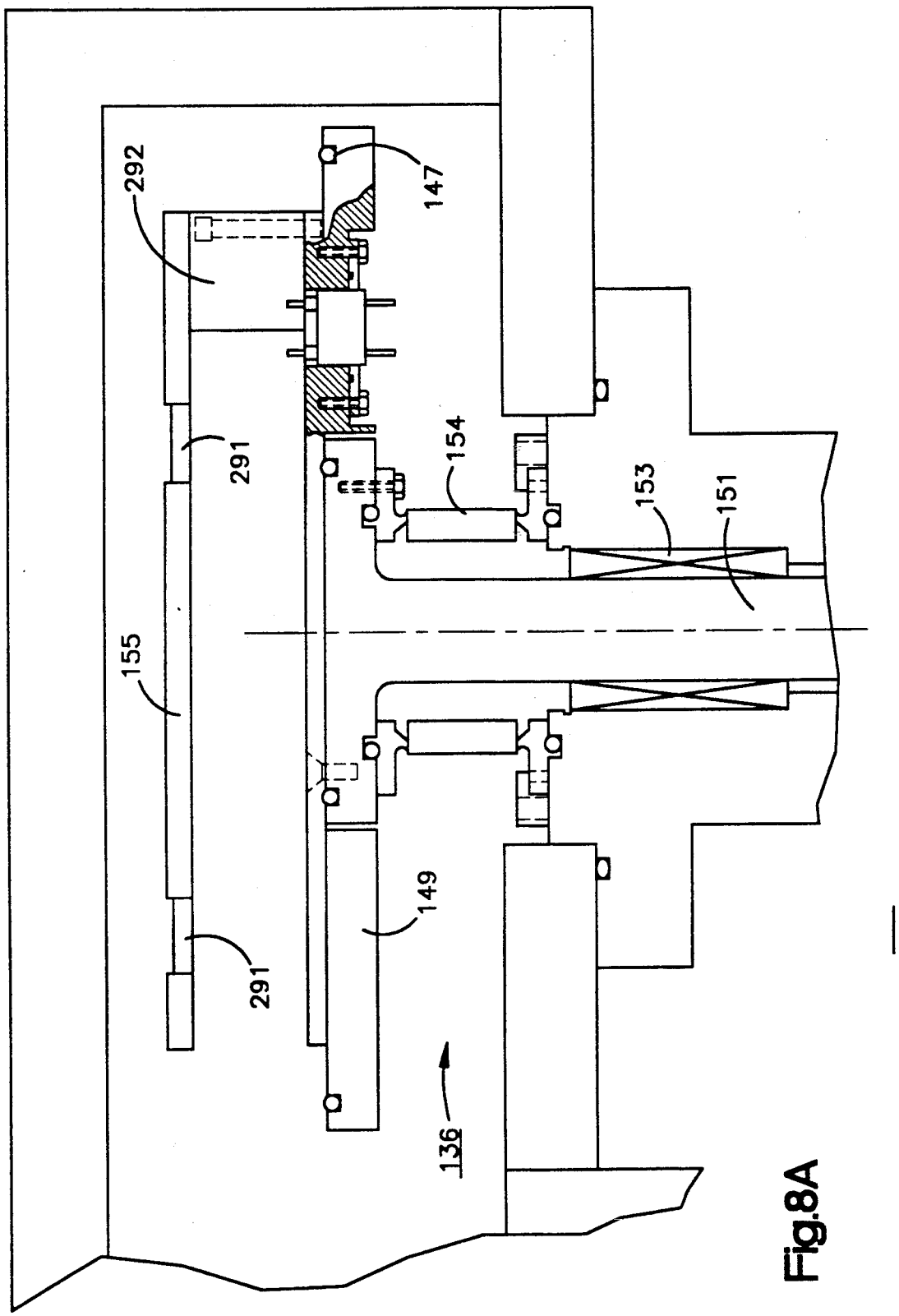
FIG. 8A is an enlarged partially sectioned view of an upper portion of the lower loadlock assembly.
Figure 15A:
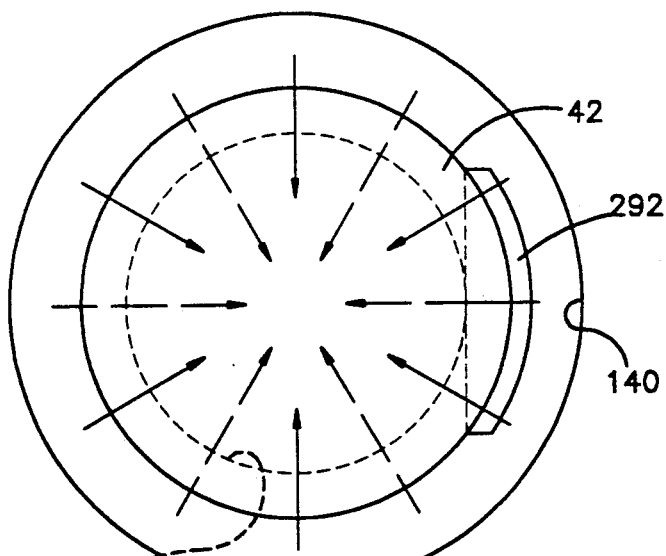
FIGS. 15A and 15B are schematic depictions showing flow patterns in a loadlock constructed in accordance with the present invention.
Figure 15B:
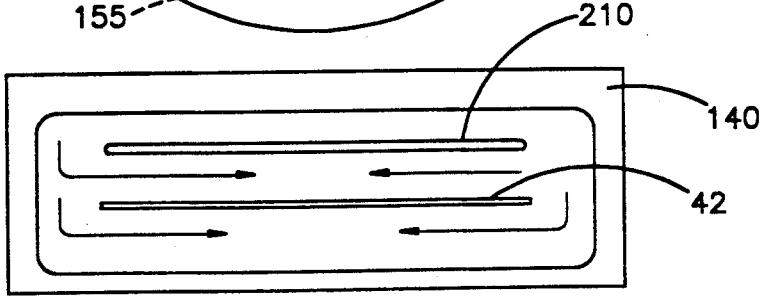

FIG. 8A is a partially sectioned side view showing the wafer support or platen 155 as part of the lower loadlock assembly 136. Notches 291 in the annular shaped platen 155 allow the wafer handler 124 and wafer transfer arm assembly 150 to contact a bottom wafer surface as it rests upon the platen 155. The platen 155 extends generally horizontally within the ion implanter loadlock and is spaced above the valve plate 149 by means of a cantilever support 292. A circular cut-out in the annular platen 155 (seen most clearly in FIG. 15A) allows fluid entering the loadlock to move radially outward over the diffuser plate 210, deflect off the inner walls of the member 140, and move inward over top and bottom wafer surfaces. This fluid flow pattern is depicted in FIGS. 15A and 15B. Spacing of the platen 155 above the valve plate 149 also allows the robotic handler and wafer handler to engage the wafer and remove it from the platen as well as place it on the platen.

The flow paths depicted in FIGS. 15A and 15B are to be contrasted with those of the prior art systems. The flow is radial and generally laminar. The bell-shaped wafer enclosing member 140 is circular in cross section and includes a radiused transition between the generally cylindrical wall portion of the member 140 and a circular, generally flat surface of the member 140 above the diffuser plate 210. Abrupt changes in flow cross section that impede particle transport are avoided. Laminar flow is enhanced and turbulence and undue dislodgement of foreign particles diminished.

Controller 300

As seen in FIG. 10, the controller 300 also interfaces with a robot wafer controller 310 coupled to the wafer handling robot 124. The controller 300 is a special purpose computer produced by Eaton Corporation, assignee of the present invention. The controller 300 interfaces with a Sun Systems microcomputer and communicates with the microcomputer via a communications link. The Sun microcomputer can download control information to the controller 300 and status information can be uploaded from the controller 300 to the Sun microcomputer.

Two motion control interfaces 320, 330 include their own microprocessors and communicate with the cell controller 300. The motion control interfaces 320, 330 actuate electric motors 322, 324, 332, 334, 184. The first three motors 322, 324, 332 are part of the rotary drive 192 and scan the wafer 42 through the beam 194, rotating the platen assembly 191 and tilt the platen assembly.

The electric motors 322, 324, 332, 184 are activated at a rate proportional to an output from a control signal from the motion control interface which is amplified by an amplifier 340 and coupled to an associated one of the d.c. motors. The performance of each motor is monitored by encoder inputs to the motion control interfaces 320, 330. As an example, the scan motor 322 generates incremental motion signals which are coupled to the motion control interface 320 by means of an encoder channel 342. A plurality of sensor inputs 344, 346 are also coupled to the motion control interfaces for monitoring movement in response to motor actuation. These sensor inputs are controlled by limit switches and/or home position sensors for the assemblies moved by the motors.

The general purpose interface 302 is a signal interface for transmitting signals from the controller 300 to various control devices coupled to the interface 302. A first switch 350 actuates the air motors to allow pressurized air to be routed to the various motors in preparation for their control movement. Three additional switches 352, 354, 356 are solenoid control switches for actuating solenoids to open and close valves 220, 222, 224, evacuating the loadlock, routing nitrogen into the loadlock during pressurization of the loadlock, and routing high-pressure nitrogen through the loadlock to perform a cleaning function.

The interface 302 is also coupled to a number of sensors 360 such as sensors for monitoring pressure within the loadlock during evacuation and repressurization. These sensors generate analog or digital signals corresponding to a sensed condition and route those signals to the interface 302.

Two cassette drive switches 362 cause the cassettes to move relative the circle C. Additional air motors 364, 366 lift the oriented wafers so they can be moved to the transfer arm and clamp the wafer in place.

The control algorithm downloaded from the Sun microcomputer to the controller 300 includes mechanisms for automatically actuating the loadlock vacuum nitrogen pressure and nitrogen cleaning valves 352, 354, 356. In particular, during high-pressure cleaning, the loadlock vacuum valve 352 is opened so that high-pressure nitrogen passing through the conduit enters the loadlock, picks up the particle contaminants within the loadlock, and allows these contaminants to be swept from the loadlock by the vacuum applied through the conduit.

Control Programs

The load cycle for inserting a wafer within the implantation chamber begins with the step 400 (FIG. 11) of loading the wafer from the cassette into the loadlock by the robotic arm assembly 124. At the next step 402, the controller 300 causes the upper loadlock assembly 134 and more particularly, the air motor 146, to move the dish-shaped sealing member 140 into engagement with a top surface of the plate 141. The evacuation valve 222 is opened at a step 404, causing the pressure within the loadlock to drop. By monitoring a sensor output, the controller 300 waits 406 until the pressure within the loadlock is beneath a set point pressure programmed by the Sun Microcontroller System.

After the pressure has dropped sufficiently low, the controller 300 opens 408 to loadlock by causing the lower loadlock assembly 136 and more particularly, the air-actuated motor 280, to lower the valve plate 149 and supported the platen 155. This lowers the wafer to a position where it can be exchanged 410 with a treated wafer in the ion implantation chamber by the wafer transfer arm assembly 150. The transfer assembly 150 causes an already treated wafer to be moved back into the loadlock position, and an untreated wafer supported by the platen 155 to be moved into the ion implantation chamber.

Figure 13:
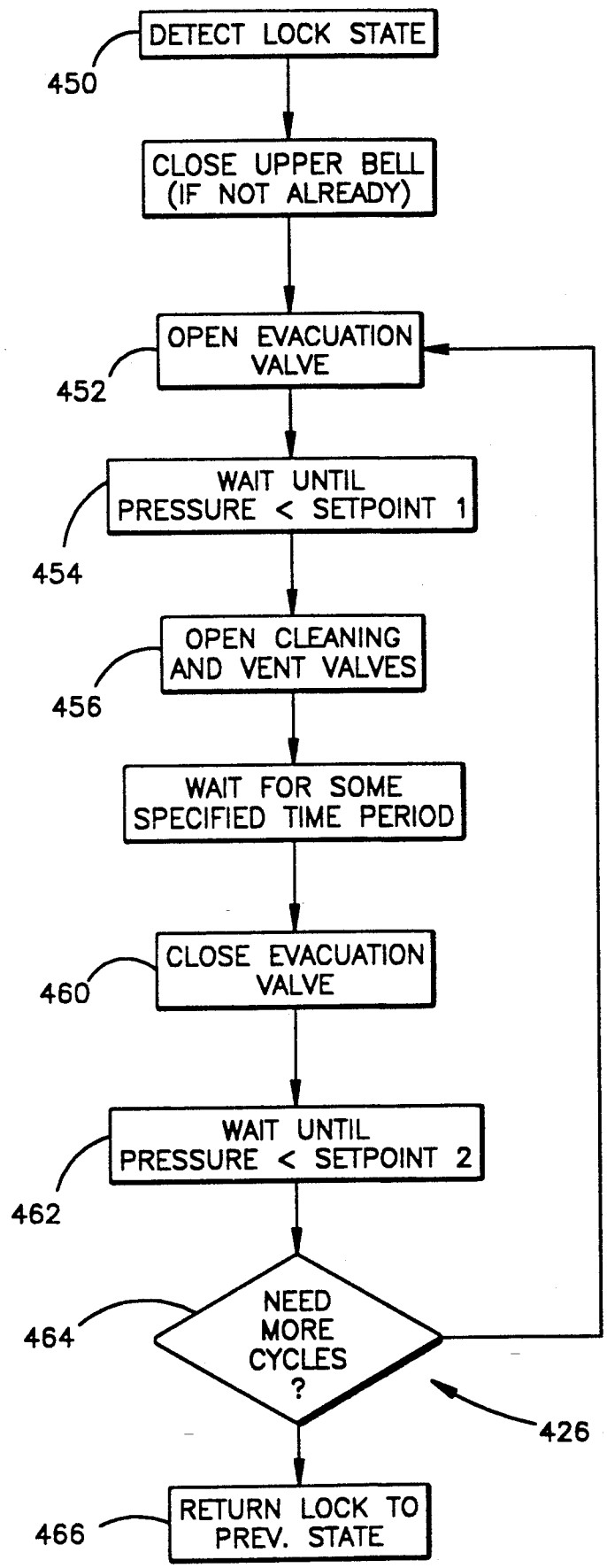
Figure 14A:
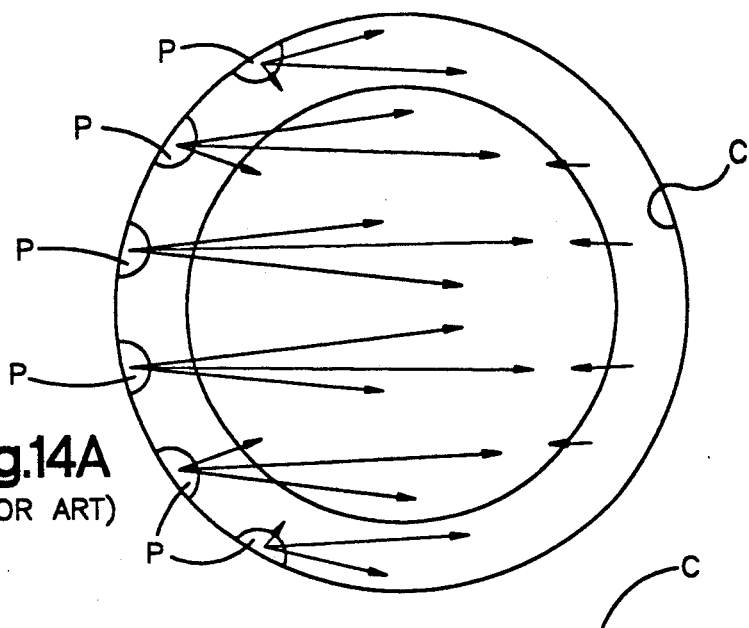
FIGS. 14A and 14B are schematic depictions of a prior art loadlock configuration.
Figure 14B:
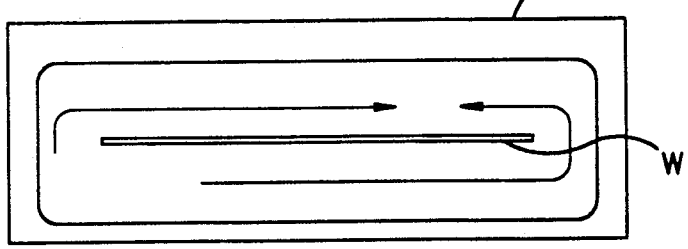

A treated wafer rests upon the platen 155 so the controller 300 causes the lower loadlock assembly 136 to raise the platen 155 by means of the valve plate 149 to close 412 the loadlock. Once a limit switch monitoring movement of the valve plate is actuated, the valve 224 is opened 414, allowing nitrogen to enter the loadlock. The controller 300 waits 416 until a sensed pressure within the loadlock exceeds a set point pressure, and then closes 418 the vent valve 224. The controller 300 then opens 420 the upper loadlock assembly 134 by raising the dish-shaped member 140. This allows the treated wafer to be removed 422 from the loadlock by the robotic arm 124. At each cycle, the controller 300 determines 424 whether an auto-clean cycle 426 is to be performed. If it is not, the controller 300 returns to the beginning of the process and loads a next subsequent wafer. If a clean cycle is to be performed, the controller 300 branches to a control algorithm depicted in FIG. 13 for performing the cleaning steps disclosed therein.

Figure 11:
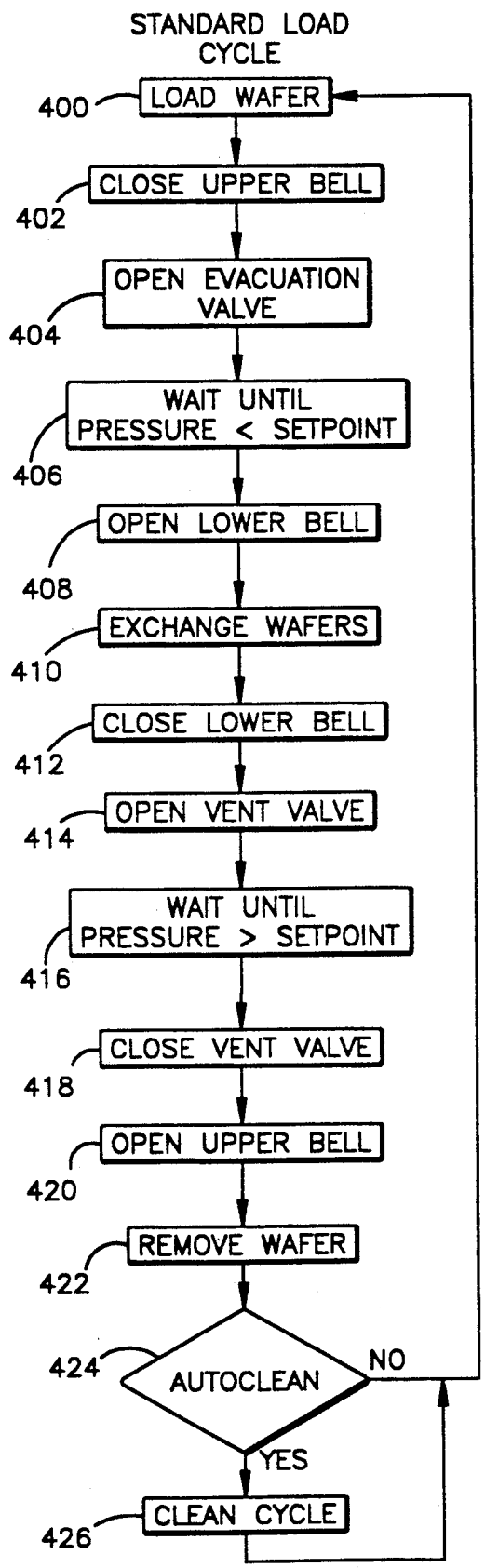
FIGS. 11-13 are flow charts for control algorithms executed by a loadlock controller depicted in FIG. 10.
Figure 12:
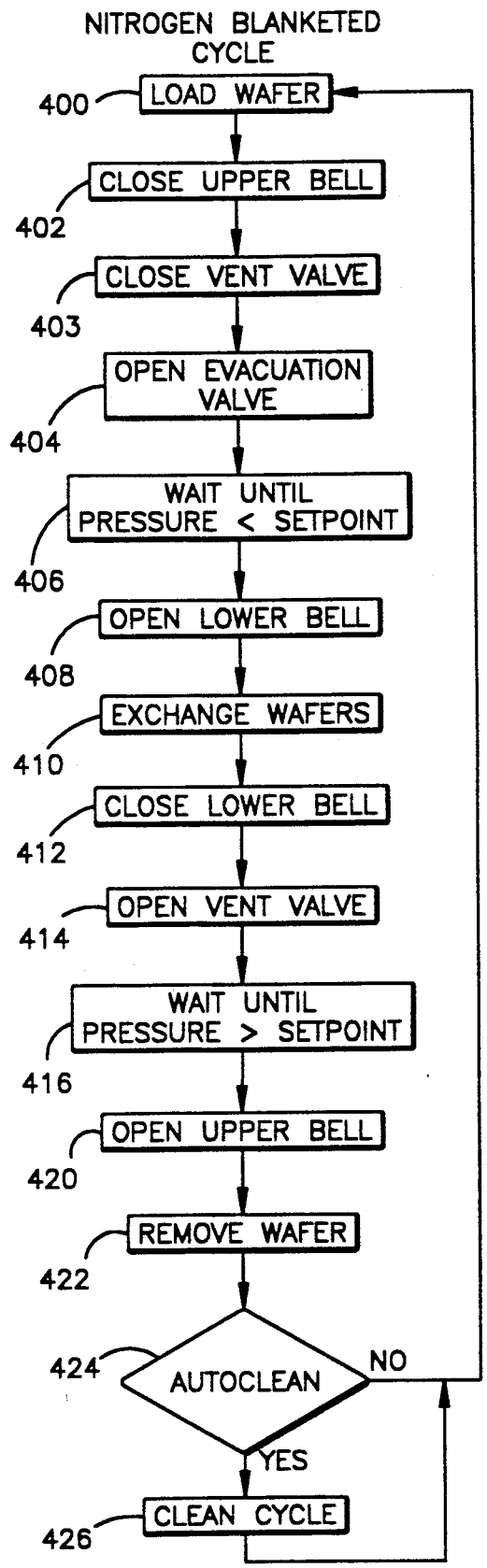

The control algorithm depicted in FIG. 12 differs slightly from that disclosed in FIG. 11. In FIG. 12, the wafer is inserted into the loadlock with the vent valve 224 open. This allows nitrogen gas to enter the loadlock and exit the loadlock around the bottom edge of the dish-shaped member 140. This impedes air from entering the loadlock as the wafer is inserted and thus inhibits water vapor from entering the loadlock and causing small particle contaminants to agglomerate to larger particles. This so-called nitrogen blanketed wafer insertion cycle includes a step 403 of closing the vent valve 224 after the wafer has been put into the loadlock and the dish-shaped member lowered into place.

The auto-clean cycle 426 is also executed by the controller 300 in response to dictates programmed by the Sun Microcontroller System. At a first step 450 of the clean cycle 426, the controller detects the status of the loadlock. If not already in such a state, the controller 300 raises the lower loadlock assembly and lowers the upper loadlock assembly, enclosing a wafer region within the dish-shaped member 140, the plate 141 and the valve plate 149. To cleanse the loadlock, the controller 300 then opens 452 the evacuation valve 222 and waits 454 until the pressure is less than a set point pressure. The controller 300 then opens 456 both the cleaning and vent valves 220, 224 to force high-pressure nitrogen into the chamber or region and simultaneously evacuate this nitrogen through the evacuation valve 222. This step is conducted for a cleansing period, after which the evacuation valve is closed 460 and the controller 300 waits 462 until the pressure is greater than a set point pressure. The controller 300 next tests 464 to determine whether more cycles of the cleaning cycle are needed. If they are, the valve 422 is again opened 452 and the cycling of nitrogen through the chamber continues. If the clean cycle has ended, the controller puts the loadlock back into the state that was sensed when the cleaning cycle began and returns 466 to the main wafer insertion algorithm of FIG. 11 or 12.

The steps 456, 460 are interchanged to accomplish pulsed cleaning of the loadlock. For this process, the pressure in the chamber is reduced and then the evacuation valve closed 460 before the cleaning and vent valves 220, 224 are opened.

The present invention has been described with a degree of particularity. It is the intent, however, that the invention include all modifications and alterations from the disclosed design falling within the spirit or scope of the appended claims.

I claim:

1. A system for treating one or more generally circular wafers comprising:
   a) a chamber that defines a chamber interior having a wafer support onto which one or more wafers are moved prior to treatment; said chamber having cylindrical internal flow-defining surfaces that encircle an outer periphery of the wafer support;

b) means for inserting wafers into the chamber and placing them on the wafer support prior to treatment and removing the wafers from the chamber after they have been treated;

c) structure for venting fluid into the chamber through a first passageway and for evacuating the chamber by withdrawing fluid from the chamber through a second passageway;

d) a controller for adjusting fluid flow entering or exiting the chamber via the first and the second passageways; and e) fluid flow distribution means mounted relative the wafer support within the chamber for providing radial fluid flow away from the cylindrical internal flow-defining surfaces to a region of the wafers during chamber venting and for providing radial fluid flow toward the cylindrical internal flow-defining surfaces from the region of the wafers during chamber evacuation to impede particle contamination of wafers within the chamber;

f) said cylindrical internal flow-defining surfaces and the flow distribution means defining a flow region through the chamber for promoting laminar fluid flow within the chamber.

2. The system of claim 1 wherein the chamber accepts wafers from a region at atmospheric pressure and delivers the silicon wafers to a region at a pressure less than atmospheric.

3. The system of claim 1 wherein the fluid flow distribution means comprises a circular diffuser plate symmetrically located within the cylindrical internal flow-defining surfaces of the chamber and wherein the first and second passageways are concentric with respect to each other and open into the chamber at locations facing the circular diffuser plate to provide radial fluid flow into and out of the chamber when venting or evacuating the chamber.

4. The system of claim 3 wherein said structure for venting fluid into the chamber comprises a third passageway for injecting a cleaning fluid into the chamber, said third passageway defined by a conduit passing through the circular diffuser plate to route cleaning fluid into direct contact with the wafer support.

5. The system of claim 4 wherein the chamber's internal flow-defining surfaces, the position of the conduit passing through the diffuser plate and an outlet of the second passageway into the chamber promotes fluid flow in a circuitous route through the chamber to clean internal flow-defining surfaces of the chamber.

6. The system of claim 1 comprising a third passageway for injecting fluid into the chamber at a location beneath the fluid flow distribution means to provide fluid flow in a circuitous route through the chamber.

7. The system of claim 1 wherein the wafer support comprises a cantilever mounted annulus having a central opening which allows fluid to contact top and bottom surfaces of wafers supported by the annulus.

8. The system of claim 1 wherein the chamber is divided into a process chamber portion and a loadlock chamber portion and further comprising transfer means for moving wafers back and forth between the process and loadlock chamber portions.

9. The system of claim 1 wherein the controller comprises a programmable controller and the structure for allowing fluid to enter the chamber and for evacuating the chamber comprises first and second valves that are opened and closed by the programmable controller.

10. The system of claim 9 wherein the programmable controller simultaneously opens the first and second valves to route cleaning fluid through the chamber for a specified time period to conduct a cleaning cycle.

11. The system of claim 10 where the programmable controller performs multiple cleaning cycles to cleanse the chamber of accumulated particles.

12. The system of claim 9 additionally comprising a third valve that routes high-pressure fluid into the chamber and wherein the programmable controller also opens and closes said third valve.

13. An ion implantation system for sequentially treating workpieces comprising:

a) an implantation chamber that defines a chamber interior into which the workpieces are moved for treatment, said chamber having an opening for inserting workpieces into the chamber prior to treatment and removing the workpieces from the chamber after they have been treated;

b) a pressure chamber in fluid communication with the implantation chamber through the opening of the implantation chamber including a region bounded by a wall having a first opening for allowing a fluid to enter the pressure chamber through an inlet flow control passageway and a second opening concentric with the first opening for evacuating the pressure chamber by withdrawing fluid in the pressure chamber through an outlet flow control passageway; and c) a flow controller for controlling fluid flow entering or exiting the pressure chamber via the first and second flow control passageways to enable workpieces to be moved into and out of the pressure chamber at atmospheric pressure and moved into and removed from the implantation chamber at a pressure less than atmospheric pressure; said controller including means for performing a cleaning cycle to cleanse contaminants from said pressure chamber by simultaneously routing pressurized fluid into the pressure chamber through the inlet flow control passageway and out the outlet flow control passageway.

14. The ion implantation system of claim 13 wherein the wall having the first and second openings comprises a bell-shaped, movable wall that supports a diffuser plate to disrupt fluid flow as the fluid enters the pressure chamber through the first and second openings.

15. A method for moving silicon wafers through a loadlock chamber to an ion implantation chamber comprising the steps of:

a) moving a generally circular wafer from a supply and placing the wafer on a wafer support;

b) moving a movable chamber wall to enclose the wafer in an intermediate chamber;

c) withdrawing fluid from the intermediate chamber through a first conduit in fluid communication with the intermediate chamber but spaced from the wafer by a diffuser plate attached to the movable chamber wall;

d) monitoring pressure within the intermediate chamber and moving the wafer into a process chamber at a reduced pressure when sensed pressure within the intermediate chamber reaches the reduced pressure;

e) processing the generally circular wafer;

f) moving the wafer from the process chamber into the intermediate chamber; and g) increasing the pressure in the intermediate chamber by infusing fluid into the intermediate chamber through a second conduit concentric with the first conduit before removing the generally circular wafer from the intermediate chamber.

16. The method of claim 15 additionally comprising the step of periodically cleansing the intermediate chamber by simultaneously infusing fluid into the intermediate chamber through the second conduit and withdrawing the fluid from the chamber through the first conduit.

17. An ion implantation system for sequentially treating workpieces comprising:
   a) an implantation chamber that defines a chamber interior into which the workpieces are moved for treatment, said chamber having a workpiece opening for inserting workpieces into the chamber prior to treatment and removing the workpieces from the chamber after they have been treated;
   b) a pressure chamber in fluid communication with the implantation chamber through the opening of the implantation chamber including a workpiece support positioned within the pressure chamber at a region bounded by a wall having a first fluid opening for allowing a fluid to enter the pressure chamber through an inlet flow control passageway and a second fluid opening concentric with the first opening for evacuating the pressure chamber by withdrawing fluid in the pressure chamber through an outlet flow control passageway;
   c) a flow diffuser mounted to a wall of the pressure chamber between the workpiece support and the first and second fluid openings that defines a radial fluid flow path to a center region of the workpiece support; and
   d) a flow controller for controlling fluid flow entering or exiting the pressure chamber via the first and second flow control passageways to enable workpieces to be moved into and out of the pressure chamber at atmospheric pressure and moved into and removed from the implantation chamber at a pressure less than atmospheric pressure; said controller including means for performing a cleaning cycle to cleanse contaminants from said pressure chamber by simultaneously routing pressurized fluid into the pressure chamber through the inlet flow control passageway and out the outlet flow control passageway.

18. The ion implantation system of claim 17 additionally comprising a third passageway that engages the flow diffuser to direct fluid against the workpiece support under the control of the flow controller.

* * * * *